United States Patent
Kim et al.

(10) Patent No.: US 10,347,705 B2
(45) Date of Patent: Jul. 9, 2019

(54) ORGANIC LIGHT EMITTING DIODE DISPLAY AND MANUFACTURING METHOD THEREOF

(71) Applicant: SAMSUNG DISPLAY CO., LTD., Yongin-si, Gyeonggi-Do (KR)

(72) Inventors: Dong Won Kim, Seoul (KR); Sung Ho Kim, Suwon-si (KR); Jong Moo Huh, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 4 days.

(21) Appl. No.: 15/251,678

(22) Filed: Aug. 30, 2016

(65) Prior Publication Data

US 2017/0170252 A1 Jun. 15, 2017

(30) Foreign Application Priority Data

Dec. 9, 2015 (KR) ........................ 10-2015-0174863

(51) Int. Cl.
*H01L 27/32* (2006.01)
*H01L 49/02* (2006.01)
*H01L 27/12* (2006.01)
*H01L 29/786* (2006.01)

(52) U.S. Cl.
CPC ...... *H01L 27/3265* (2013.01); *H01L 27/3262* (2013.01); *H01L 28/60* (2013.01); *H01L 27/1225* (2013.01); *H01L 27/1255* (2013.01); *H01L 29/7869* (2013.01); *H01L 2227/323* (2013.01)

(58) Field of Classification Search
CPC ............ H01L 27/3265; H01L 27/3262; H01L 27/1225; H01L 27/1255
See application file for complete search history.

(56) References Cited

U.S. PATENT DOCUMENTS

2014/0326963 A1* 11/2014 Yang ........................ H01L 51/56
257/40
2014/0333864 A1* 11/2014 Miyake ............... H01L 27/1255
349/43

FOREIGN PATENT DOCUMENTS

| KR | 1020090105561 | 10/2009 |
| KR | 10-1073272 | 10/2011 |
| KR | 1020110109885 | 10/2011 |
| KR | 1020140131774 | 11/2014 |

* cited by examiner

*Primary Examiner* — Douglas M Menz
(74) *Attorney, Agent, or Firm* — F. Chau & Associates, LLC

(57) ABSTRACT

An organic light emitting diode display, includes a substrate; a thin film transistor and a storage capacitor that are disposed and spaced apart from each other on the substrate; and an organic light emitting diode that is connected to the thin film transistor. The storage capacitor includes a capacitor lower electrode, a capacitor insulating layer disposed on the capacitor lower electrode, and a capacitor upper electrode disposed on the capacitor insulating layer. The capacitor lower electrode is a conducting oxide semiconductor into which hydrogen has diffused.

8 Claims, 16 Drawing Sheets

ORGANIC LIGHT EMITTING DIODE DISPLAY AND MANUFACTURING METHOD THEREOF

CROSS-REFERENCE TO RELATED APPLICATION

This application claims priority under 35 U.S.C. § 119 from, and the benefit of, Korean Patent Application No. 10-2015-0174863, filed in the Korean Intellectual Property Office on Dec. 9, 2015, the contents of which are herein incorporated by reference in their entirety.

BACKGROUND (a) Technical Field

Embodiments of the present disclosure are directed to an organic light emitting diode (OLED) display and a manufacturing method thereof.

(b) Description of the Related Art

An organic light emitting diode (OLED) display includes two electrodes and an organic emission layer interposed therebetween, wherein electrons injected from one electrode and holes injected from the other electrode are combined in the organic emission layer to generate excitons, and the generated excitons release energy to emit light. By using such light emission, an OLED display can display a predetermined image.

An OLED display may have a reduced thickness and weight as compared to a liquid crystal display since an OLED display is self-luminance and does not require an additional light source, unlike a liquid crystal display. In addition, an OLED display may be a next generation display device since it features low power consumption, high luminance, and high response speed.

An OLED display includes a plurality of pixels, each including an organic light emitting diode, which is a self-light-emitting device, a plurality of transistors which drive the organic light emitting diode, and one or more capacitors.

There are various methods of forming the capacitors, depending on their structures and materials.

SUMMARY

Embodiments of the present disclosure can provide an organic light emitting diode display in which a capacitor is formed by using an oxide semiconductor.

An exemplary embodiment of the present disclosure provides an organic light emitting diode display that includes a substrate; a thin film transistor and a storage capacitor that are disposed and spaced apart from each other on the substrate; and an organic light emitting diode that is connected to the thin film transistor. The storage capacitor includes a capacitor lower electrode, a capacitor insulating layer disposed on the capacitor lower electrode, and a capacitor upper electrode disposed on the capacitor insulating layer. The capacitor lower electrode is a conducting oxide semiconductor into which hydrogen has diffused.

The thin film transistor may include: a semiconductor layer that includes a channel region, a source region, and a drain region; a gate insulating layer disposed on the channel region; a gate electrode disposed on the gate insulating layer; a source electrode connected to the source region; and a drain electrode that is spaced apart from the source electrode and is connected to the drain region. The semiconductor layer may include the oxide semiconductor.

The gate insulating layer and the capacitor insulating layer may be made of a same material.

The capacitor insulating layer may cover side surfaces of the capacitor lower electrode.

The gate electrode may include a first gate electrode disposed on the gate insulating layer and a second gate electrode disposed on the first gate electrode.

The first gate electrode and the capacitor upper electrode may be made of a same material.

The first gate electrode and the capacitor upper electrode may include at least one of molybdenum, aluminum, indium tin oxide, and indium zinc oxide, and the second gate electrode may include at least one of titanium, a titanium-molybdenum alloy, and an aluminum oxide.

The OLED display may further include an interlayer insulating layer disposed on the gate electrode and the capacitor upper electrode and that includes at least one of a silicon nitride and a silicon oxide, wherein the source electrode and the drain electrode may be disposed in the interlayer insulating layer.

The interlayer insulating layer may include a source exposure hole that exposes the source region and a drain exposure hole that exposes the drain electrode, wherein the source electrode is connected to the source region through the source exposure hole, and the drain electrode is connected to the drain region through the drain exposure hole.

An exemplary embodiment of the present disclosure provides a method of manufacturing an organic light emitting diode display that includes forming a first oxide semiconductor layer and a second oxide semiconductor layer spaced apart from each other on a substrate; forming a gate insulating layer on the first oxide semiconductor layer that exposes portions of the first oxide semiconductor layer; forming a capacitor insulating layer on the second oxide semiconductor layer; forming a gate electrode on the gate insulating layer and forming a capacitor upper electrode on the capacitor insulating layer; forming a source region and a drain region by injecting impurities into exposed portions of the first oxide semiconductor layer; forming an interlayer insulating layer on the gate electrode, the capacitor upper electrode, the source region, and the drain region, wherein the capacitor lower electrode is formed from hydrogen diffusing from the interlayer insulating layer into the second oxide semiconductor layer wherein the second oxide semiconductor layer becomes a conductor.

The method further includes forming a source electrode and a drain electrode spaced apart from each other on the interlayer insulating layer; forming a planarization layer on the source electrode, the drain electrode, and the interlayer insulating layer; and forming an organic light emitting diode on the planarization layer.

Forming the gate electrode and the capacitor upper electrode may include: sequentially forming a first gate metal layer and a second gate metal layer on the first oxide semiconductor layer, the gate insulating layer, and the capacitor insulating layer; forming a first photosensitive film on the second gate metal layer, wherein the first photosensitive film includes a first part and a second part that is thinner than the first part; forming the gate electrode by etching the first gate metal layer and the second gate metal layer using the first part of the first photosensitive film as a mask, and the capacitor upper electrode and a gate metal pattern on the capacitor upper electrode by etching the first gate metal layer and the second gate metal layer using the second part of the first photosensitive film as a mask; forming a second photosensitive film by ashing the second part of the first photosensitive film; removing the gate metal pattern using the second photosensitive film as a mask; and removing the second photosensitive film. The first part of the first photosensitive film may be formed on a portion of the second gate metal layer that corresponds to the gate insulating layer, and the second part of the first photosensitive film may be formed on a portion of the second gate metal layer that corresponds to the capacitor insulating layer.

Forming the gate electrode and the capacitor upper electrode may include: sequentially forming the first gate metal layer and the second gate metal layer on the first oxide semiconductor layer, the gate insulating layer, and the capacitor insulating layer; forming a third photosensitive film a portion of the second gate metal layer that corresponds to the gate insulating layer and on a portion of the second gate metal layer that corresponds to the capacitor insulating layer; forming the gate electrode on the gate insulating layer and the capacitor upper electrode and the gate metal pattern on the capacitor upper electrode by etching the first gate metal layer and the second gate metal layer by using the third photosensitive film as a mask; forming a fourth photosensitive film on the gate electrode after removing the third photosensitive film; removing the gate metal pattern using the fourth photosensitive film as a mask; and removing the fourth photosensitive film.

Forming the gate electrode and the capacitor upper electrode may include: forming the first gate metal layer on the first oxide semiconductor layer, the gate insulating layer, and the capacitor insulating layer; forming a fifth photosensitive film on a portion of the first gate metal layer that corresponds to the gate insulating layer and on a portion of the first gate metal layer that corresponds to the capacitor insulating layer; forming the first gate electrode and the capacitor upper electrode by etching the first gate metal layer using the fifth photosensitive film as a mask; forming the second gate metal layer on the first oxide semiconductor layer, the first gate electrode, and the capacitor upper electrode, after removing the fifth photosensitive film; forming a sixth photosensitive film on a portion of the second gate metal layer that corresponds to the first gate electrode; forming the second gate electrode by etching the second gate metal layer using the sixth photosensitive film as a mask; and removing the sixth photosensitive film.

An exemplary embodiment of the present disclosure provides a method of manufacturing an organic light emitting diode display that includes forming a thin film transistor and a storage capacitor spaced apart from each other on a substrate, wherein the thin film transistor includes a first oxide semiconductor layer comprising a channel region, a source region, and a drain region, a gate insulating layer disposed on the channel region, and a gate electrode disposed on the gate insulating layer, and the storage capacitor includes a second oxide semiconductor layer, a capacitor insulating layer disposed on the second oxide semiconductor layer, and a capacitor upper electrode disposed on the capacitor insulating layer; forming an insulating layer on the thin film transistor and a storage capacitor; and forming an organic light emitting diode on the insulating layer and that is connected to the thin film transistor. A capacitor lower electrode is formed from hydrogen diffusing from the insulating layer into the second oxide semiconductor layer wherein the second oxide semiconductor layer becomes a conductor.

Forming the thin film transistor and storage capacitor may include: forming the first oxide semiconductor layer and the second oxide semiconductor layer spaced apart from each other on the substrate; forming the gate insulating layer on the first oxide semiconductor layer that exposes portions of the first oxide semiconductor layer; forming the capacitor insulating layer on the second oxide semiconductor layer; forming the gate electrode on the gate insulating layer and forming the capacitor upper electrode on the capacitor insulating layer; and forming the source region and the drain region by injecting impurities into exposed portions of the first oxide semiconductor layer.

According to the exemplary embodiments of the present disclosure, as the capacitor upper electrode is formed of a material that hydrogen can penetrate, and as hydrogen of the interlayer insulating layer diffuses into the oxide semiconductor layer to form the capacitor lower electrode, it is possible to form the capacitor lower electrode from the oxide semiconductor without an additional process.

DETAILED DESCRIPTION OF EXEMPLARY EMBODIMENTS

Figure 1:
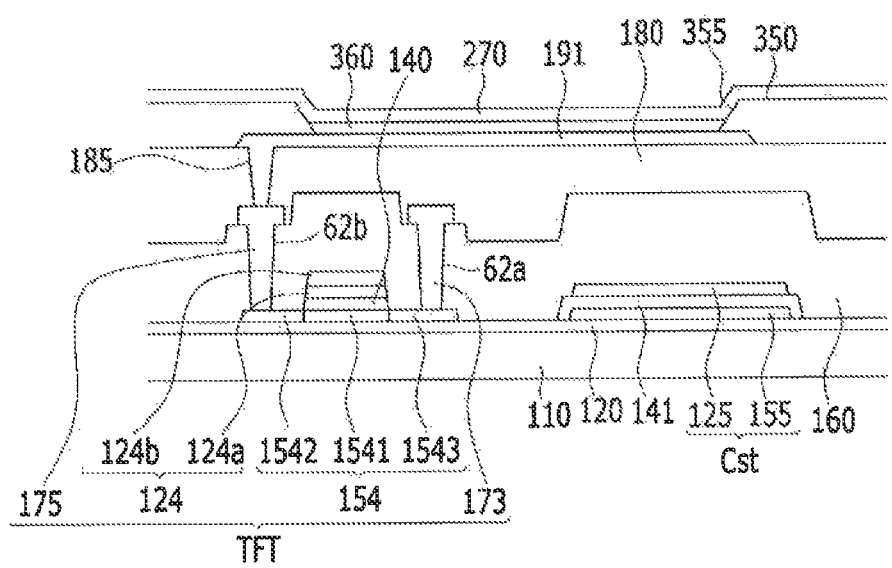
FIG. 1 is a cross-sectional view of an organic light emitting diode (OLED) display according to an exemplary embodiment of the present disclosure.

Embodiments of the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

To clearly describe the present disclosure, parts that are irrelevant to the description are omitted, and like numerals may refer to like or similar constituent elements throughout the specification.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

FIG. 1 is a cross-sectional view of an organic light emitting diode (OLED) display according to an exemplary embodiment of the present disclosure.

Referring to FIG. 1, an organic light emitting diode (OLED) display includes a substrate 110 and a plurality of thin film structures disposed on the substrate 110. The plurality of thin film structures will now be described.

The substrate 110 may be a transparent insulating substrate made of glass, quartz, ceramic, plastic, etc. Moreover, the substrate 110 may be a metallic substrate made of stainless steel, etc.

A buffer layer 120 is disposed on the substrate 110. The buffer layer 120 may be a single layer of a silicon nitride (SiNx), or a dual-layer structure that includes stacked silicon nitride (SiNx) and silicon oxide (SiOx) layers. The buffer layer 120 prevents permeation of undesirable substances, such as impurities or moisture, and simultaneously flattens a surface. The buffer layer 120 may be omitted depending on the type of substrate 110 or process conditions.

A semiconductor layer 154 and a capacitor lower electrode 155 are disposed spaced apart from each other on the buffer layer 120.

The semiconductor layer 154 is made of an oxide semiconductor, and includes a channel region 1541, a source region 1543, and a drain region 1542.

The oxide semiconductor includes at least one oxide based on zinc (Zn), gallium (Ga), tin (Sn), and indium (In), and complex oxides thereof such as zinc oxide (ZnO), indium-gallium-zinc oxide ($InGaZnO_4$), indium-zinc oxide (In—Zn—O), and zinc-tin oxide (Zn—Sn—O).

The source region 1543 and the drain region 1542 are disposed on opposite sides of the channel region 1541. The channel region 1541 is an oxide semiconductor having no doped impurities, and the source region 1543 and the drain region 1542 are each impurity semiconductors having doped conductive impurities.

The capacitor lower electrode 155 is made of a conducting oxide semiconductor. The capacitor lower electrode 155 is made to conduct by diffusing hydrogen from an interlayer insulating layer 160, described below, into the oxide semiconductor to increase the carrier concentration.

A gate insulating layer 140 is disposed on the channel region 1541 of the semiconductor layer 154, and a capacitor insulating layer 141 is disposed on the capacitor lower electrode 155. The capacitor insulating layer 141 covers side surfaces of the capacitor lower electrode 155.

The gate insulating layer 140 and the capacitor insulating layer 141 are made of the same material and have the same thickness. The gate insulating layer 140 and the capacitor insulating layer 141 include at least one of a silicon oxide (SiOx) and a silicon nitride (SiNx).

A gate electrode 124 is disposed on the gate insulating layer 140, and a capacitor upper electrode 125 is disposed on the capacitor insulating layer 141.

The gate electrode 124 includes a first gate electrode 124a disposed on the gate insulating layer 140 and a second gate electrode 124b disposed on the first gate electrode 124a.

The first gate electrode 124a and the capacitor upper electrode 125 are made of the same material, and may include at least one of molybdenum (Mo), aluminum (Al), indium tin oxide (ITO), and indium zinc oxide (IZO).

The second gate electrode 124b includes at least one of titanium (Ti), a titanium-molybdenum (Mo) alloy, or an aluminum oxide ($Al_2O_3$).

Here, the capacitor lower electrode 155 and the capacitor upper electrode 125 form a storage capacitor Cst using the capacitor insulating layer 141 as a dielectric material. Here, since the capacitor insulating layer 141 is thinner than other insulating layers, capacitance thereof is easily secured.

The interlayer insulating layer 160 is disposed on the source region 1543 and the drain region 1542 of the semiconductor layer 154, the gate electrode 124, and the capacitor upper electrode 125. The interlayer insulating layer 160 may be a single layer or multiple layers that include at least one of a silicon nitride (SiNx) and a silicon oxide (SiOx).

The interlayer insulating layer 160 is provided with a source exposure hole 62a and a drain exposure hole 62b which respectively expose the source region 1543 and the drain regions 1542.

A source electrode 173 and a drain electrode 175 are disposed spaced apart from each other in the interlayer insulating layer 160. The source electrode 173 and the drain electrode 175 are respectively connected to the source region 1543 and the drain region 1542 through the source exposure hole 62a and the drain exposure hole 62b.

The semiconductor layer 154, the gate electrode 124, the source electrode 173, and the drain electrode 175 form a thin film transistor (TFT).

A planarization layer 180 is disposed on the interlayer insulating layer 160, the source electrode 173, and the drain electrode 175. The planarization layer 180 is made of an organic material, and an upper surface thereof is flattened. The planarization layer 180 is provided with a contact hole 185 through which a portion of the drain electrode 175 is exposed.

A pixel electrode 191 and a pixel defining layer 350 are disposed on the planarization layer 180.

The pixel electrode 191 is electrically connected to the drain electrode of the thin film transistor (TFT) through the contact hole 185 formed in the planarization layer 180. The pixel electrode 191 may be made of a reflective metal such as lithium (Li), calcium (Ca), lithium fluoride/calcium (LiF/Ca), lithium fluoride/aluminum (LiF/Al), aluminum (Ag), silver (Ag), magnesium (Mg), gold (Au), etc.

The pixel defining layer 350 is disposed on the planarization layer 180 at an edge portion of the pixel electrode 191, and is provided with an opening 355 through which the pixel electrode 191 is exposed. For example, the edge portion of the pixel electrode 191 is disposed below the pixel defining layer 350.

An organic emission layer 360 is disposed on the pixel electrode 191 in the opening 355 of the pixel defining layer 350.

The organic emission layer 360 includes multiple layers, including one or more emission layers, a hole-injection layer (HIL), a hole-transporting layer (HTL), an electron-transporting layer (ETL), and an electron-injection layer (EIL). When the organic emission layer 360 includes all of the aforementioned layers, the hole-injection layer is disposed on the pixel electrode 191 as the anode, and the hole-transporting layer, the emission layer, the electron-transporting layer, and the electron-injection layer are sequentially stacked thereon.

The organic emission layer 360 includes a red organic emission layer that emits red light, a green organic emission layer that emits green light, and a blue organic emission layer that emits blue light. The red organic emission layer, the green organic emission layer, and the blue organic emission layer are respectively formed on a red pixel, a green pixel, and a blue pixel to display a color image.

Alternatively, in the organic light emission layer 360, a color image may be displayed by stacking each of the red, green, and blue organic light emission layers on the red pixel, the green pixel, and the blue pixel and then forming red, green, and blue color filters for each pixel. As another example, a color image may be displayed by forming a white organic emission layer that emits white light on each of the red, green, and blue pixels, and respectively forming red, green, and blue color filters for each pixel. When a color image is displayed by a white organic emission layer and a color filter, a deposition mask for depositing the red, green, and blue organic emission layers on each pixel, that is, the red, green, and blue pixels, is not required.

A white organic emission layer described with respect to another exemplary embodiment may be formed as a single organic emission layer, and may further include a laminated plurality of organic emission layers that emit white light. For example, the white organic emission layer for emitting white light may include at least one yellow organic emission layer combined with at least one blue organic emission layer, at least one cyan organic emission layer combined with at least one red organic emission layer, and at least one magenta organic emission layer combined with at least one green organic emission layer.

A common electrode 270 is disposed on the pixel defining layer 350 and the organic emission layer 360

The common electrode 270 is made of a transparent conductive material such as indium tin oxide (ITO), indium zinc oxide (IZO), zinc oxide (ZnO), or indium oxide ($In_2O_3$). In a present exemplary embodiment, the pixel electrode 191 is made of a reflective metal and the common electrode 207 is made of a transparent conductive material, but they are not limited thereto, and the pixel electrode 191 may be made of a transparent conductive material, and the common electrode 207 may be made of a reflective metal.

Here, the pixel electrode 191, the organic emission layer 360, and the common electrode 270 form the organic light emitting diode. In this case, the pixel electrode 191 may bean anode electrode of the organic light emitting diode LD, and the common electrode 270 may be a cathode electrode of the organic light emitting diode OLED.

A capping layer which protects the organic light emitting diode OLED and simultaneously transmits light generated from the organic emission layer 360 to the outside may be disposed on the common electrode 270.

In addition, an encapsulation substrate bonded to the substrate 110 by a sealant can be disposed on the common electrode 270.

A manufacturing method of an OLED display according to an exemplary embodiment of the present disclosure will now be described with reference to FIGS. 2 to 9.

FIGS. 2 to 9 are schematic cross-sectional views of a manufacturing method of an OLED display according to an exemplary embodiment of the present disclosure.

Figure 2:
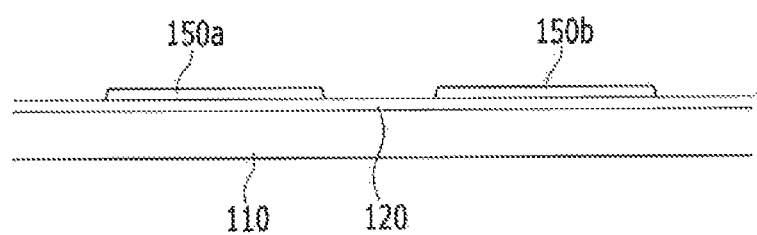
FIGS. 2 to 9 are schematic cross-sectional views of a manufacturing method of an OLED display according to an exemplary embodiment of the present disclosure.

Referring to FIG. 2, the buffer layer 120 is formed on the substrate 110, after which a first oxide semiconductor layer 150a and a second oxide semiconductor layer 150b are formed on the buffer layer 120. The first oxide semiconductor layer 150a and the second oxide semiconductor layer 150b are spaced apart from each other.

Figure 3:
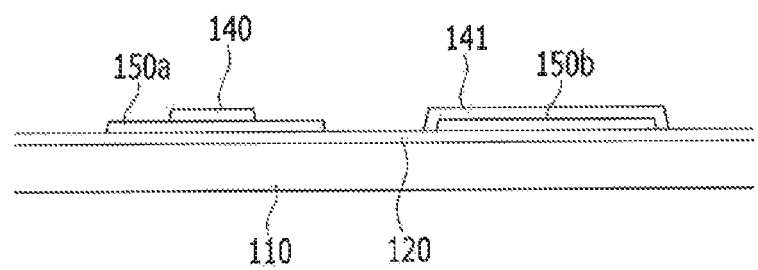

Referring to FIG. 3, the gate insulating layer 140 is formed on the first oxide semiconductor layer 150a, and the capacitor insulating layer 141 is formed on the second semiconductor layer 150b. The gate insulating layer 140 exposes portions of the first oxide semiconductor layer 150a, and the capacitor insulating layer 141 covers upper and side surfaces of the second oxide semiconductor layer 150b.

Figure 4:
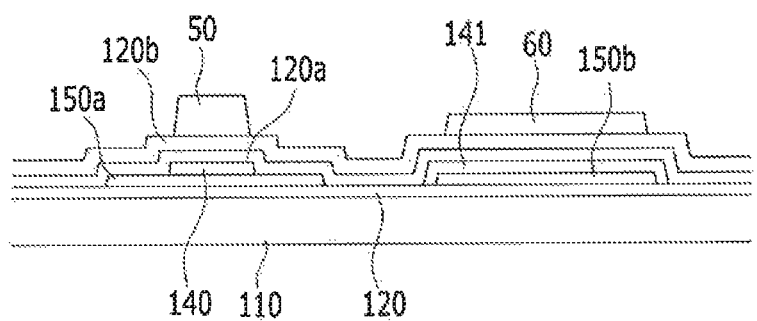

Referring to FIG. 4, a first gate metal layer 120a and a second gate metal layer 120b are sequentially formed on the first oxide semiconductor layer 150a, the gate insulating layer 140, the capacitor insulating layer 141, and the buffer layer 120.

The first gate metal layer 120a includes at least one of molybdenum (Mo), aluminum (Al), indium tin oxide (ITO), and indium zinc oxide (IZO). The second gate metal layer 120b includes at least one of titanium (Ti), a titanium-molybdenum (Mo) alloy, and aluminum oxide ($Al_2O_3$).

Next, first photosensitive films 50 and 60 are formed on the second gate metal layer 120b. The first photosensitive films 50 and 60 are formed using a half-tone mask or a slit mask, and include a first part 50 and a second part 60, which is thinner than the first part 50. The first part 50 is formed on the portion of the second gate metal layer 120b that corresponds to the gate insulating layer 140, and the second part 60 is formed on the portion of the second gate metal layer 120b that corresponds to the capacitor insulating layer 141.

Figure 5:
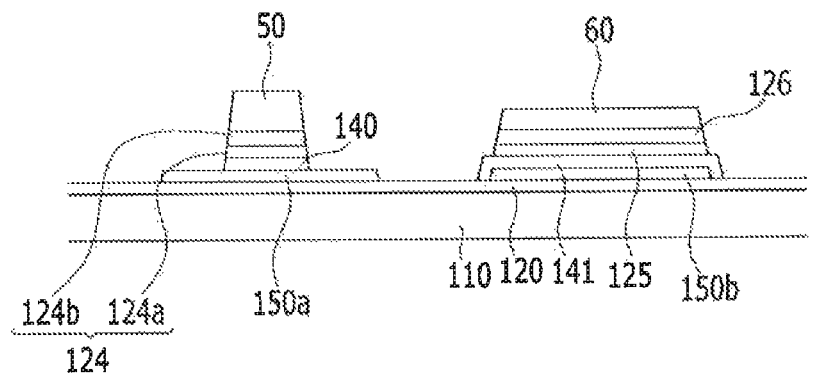

Referring to FIG. 5, the first gate metal layer 120a and the second gate metal layer 120b are etched using the first photosensitive films 50 and 60 as a mask.

Here, the gate electrode 124 is formed under the first part 50. The gate electrode 124 includes the first gate electrode 124a on the gate insulating layer 140 formed from the first gate metal layer 120a and the second gate electrode 124b on the first gate electrode 124a formed from the second gate metal layer 120b.

The capacitor upper electrode 125 and a gate metal pattern 126 are formed under the second part 60 from the first gate metal layer 120a and the second gate metal layer 120b, respectively. Here, the capacitor upper electrode 125 is formed on the capacitor insulating layer 141, and the gate metal pattern 126 is formed on the capacitor upper electrode 125.

The first gate electrode 124a and the capacitor upper electrode 125 are made of the same material, and the second gate electrode 124b and the gate metal pattern 126 are made of the same material.

Figure 6:
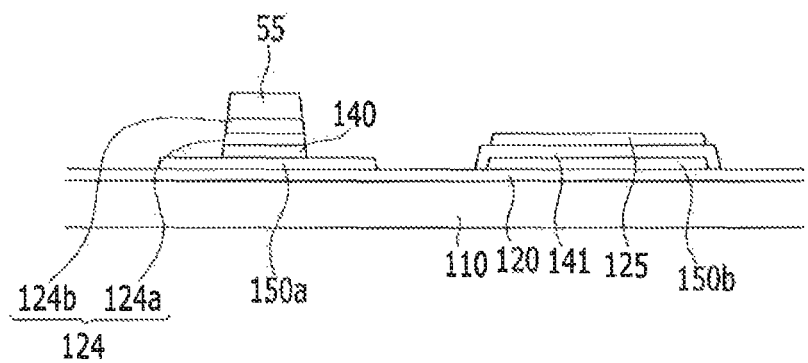

Referring to FIG. 6, a second photosensitive film 55 is formed by ashing the first photosensitive films 50 and 60.

When the first photosensitive films 50 and 60 are processed by ashing, the second part 60 is removed and the thickness of the first part 50 is reduced, such that the second photosensitive film 55 is formed.

Next, the gate metal pattern 126 is etched and removed using the second photosensitive film 55 as a mask. In this case, during wet etching, the gate metal pattern 126 is removed, but the capacitor upper electrode 125 is not removed.

Figure 7:
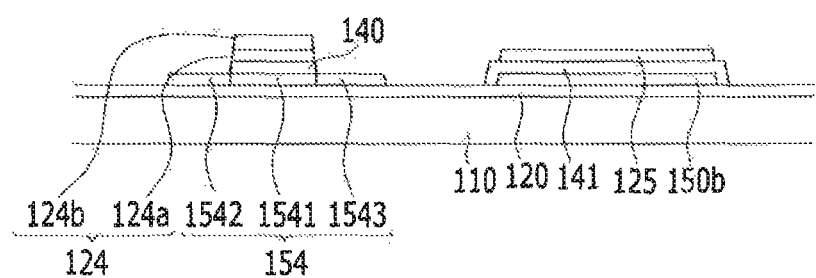

Referring to FIG. 7, the second photosensitive film 55 is removed, after which the source region 1543 and the drain region 1542 are formed by doping the impurities in the first oxide semiconductor layer 120b exposed by the gate insulating layer 140. Here, the first oxide semiconductor layer 150a region covered by the gate insulating layer 140 becomes the channel region 1541. Thus, the first oxide semiconductor layer 150a becomes the semiconductor layer 154, which includes the channel region 1541, the source region 1543, and the drain region 1542.

Figure 8:
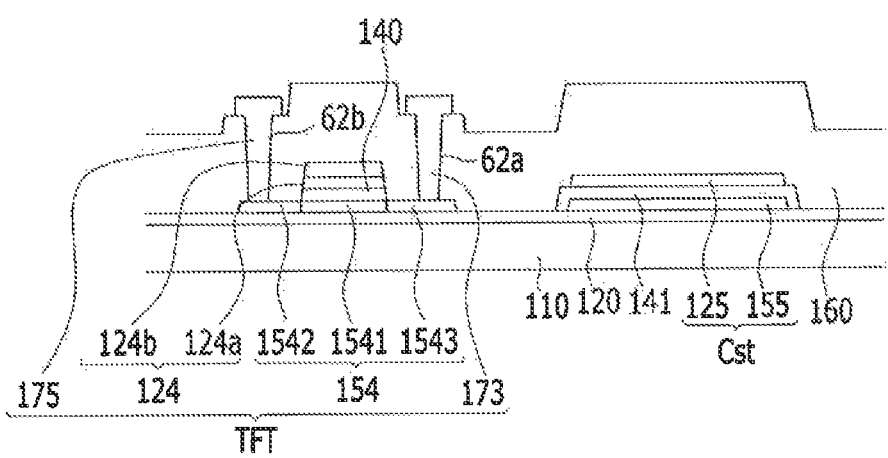

Referring to FIG. 8, the interlayer insulating layer 160 is formed on the source region 1543, the drain region 1542, the gate electrode 124, and the capacitor upper electrode 125, after which the source electrode 173 and the drain electrode 175 are formed on the interlayer insulating layer 160.

The interlayer insulating layer 160 includes the source exposure hole 62a which exposes some of the source region 1543 and the drain exposure hole 62b which exposes some of the drain region 1542.

When the interlayer insulating layer 160 is formed, a heat treatment process is performed during which hydrogen H included in the interlayer insulating layer 160 diffuses into the second oxide semiconductor layer 150b. Specifically, hydrogen H included in the interlayer insulating layer 160 penetrates the capacitor upper electrode 125 and the capacitor insulating layer 141, and then diffuses into the second oxide semiconductor layer 150b. Thus, the carrier concentration of the second oxide semiconductor layer 150b increases due to the hydrogen diffused from the interlayer insulating layer 160, such that the second oxide semiconductor layer 150b becomes a conductor and functions as the capacitor lower electrode 155.

On the other hand, hydrogen H does not penetrate the second gate electrode 124b from the interlayer insulating layer. Thus, hydrogen H included in the interlayer insulating layer 160 does not diffuse into the channel region 1541 disposed under the gate electrode 124.

Hydrogen H included in the interlayer insulating layer 160 may diffuse into the source region 1543 and the drain region 1542.

The source electrode 173 is connected to the source region 1543 through the source exposure hole 62a, and the drain electrode 175 is connected to the drain region 1542 through the drain exposure hole 62b.

As such, the capacitor upper electrode 125 is formed of the material that hydrogen can penetrate, so that when the interlayer insulating layer 160 is formed, hydrogen of the interlayer insulating layer 160 can diffuse into the second oxide semiconductor layer 150b, which becomes conducting to function as the capacitor lower electrode 155, thereby forming the lower electrode of the capacitor with the oxide semiconductor without an additional process.

Figure 9:
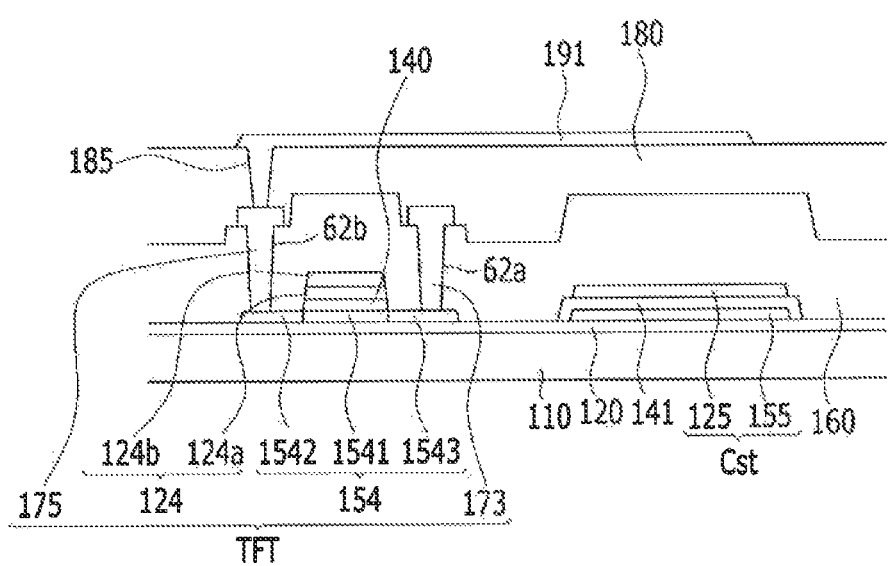

Referring to FIG. 9, the planarization layer 180 is formed on the source electrode 173, the drain electrode 175, and the interlayer insulating layer 160, after which the pixel electrode 191 is formed on the planarization layer 180.

The planarization layer 180 has a substantially flat upper surface, and is provided with the contact hole 185 which exposes some of the drain electrode 175.

The pixel electrode 191 is connected to the drain electrode 175 through the contact hole 185.

Referring to FIG. 1, the pixel defining layer 350 is formed at an edge of the pixel electrode 191 and on the planarization layer 180. The pixel defining layer 350 includes the opening 355 which exposes the pixel electrode 191.

Next, the organic emission layer 360 is formed on the pixel electrode 191 in the opening 355, after which the common electrode 270 is formed on the pixel defining layer 350 and the organic emission layer 360.

Hereinafter, a manufacturing method of an organic light emitting diode (OLED) display according to another exemplary embodiment of the present disclosure will be described with reference to FIGS. 10 to 12.

Figure 10:
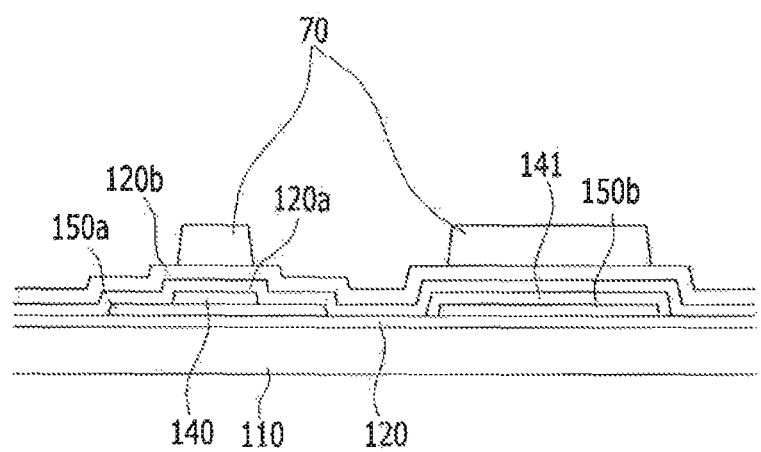
FIGS. 10 to 12 are schematic cross-sectional views of a manufacturing method of an OLED display according to another exemplary embodiment of the present disclosure.
Figure 11:
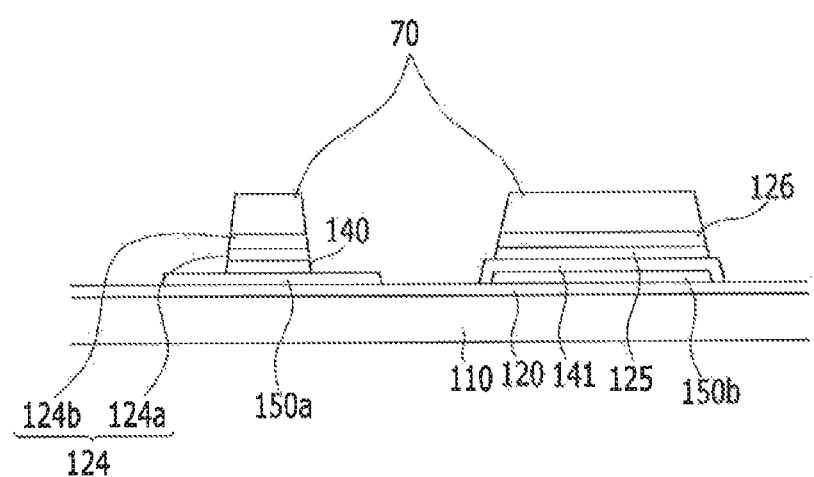
Figure 12:
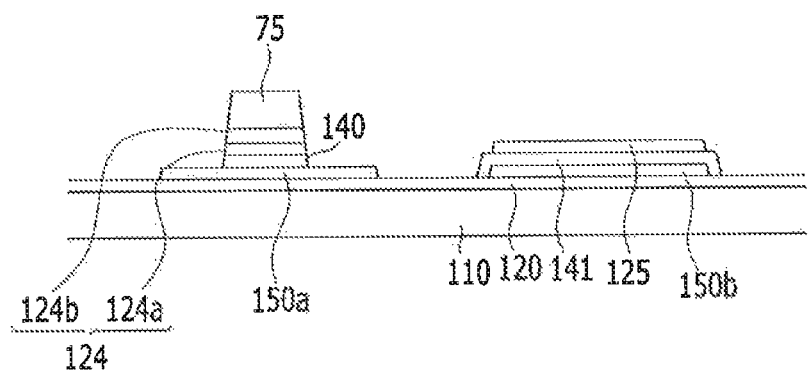

FIGS. 10 to 12 are schematic cross-sectional views of a manufacturing method of an OLED display according to another exemplary embodiment of the present disclosure.

A manufacturing method of an OLED display according to a present exemplary embodiment is substantially the same as a manufacturing method of an OLED display according to FIGS. 2 to 9, except for a process of forming the capacitor upper electrode 125. Accordingly, a duplicate description of the same method will be omitted.

Referring to FIG. 10, the buffer layer 120 is formed on the substrate 110, and the first and second spaced apart oxide semiconductor layers 150a and 150b are formed on the buffer layer 120.

Next, the gate insulating layer 140 is formed on the first semiconductor layer 150a, and the capacitor insulating layer 141 is formed on the second oxide semiconductor layer 150b.

Subsequently, the first gate metal layer 120a and the second gate metal layer 120b are sequentially formed on the first oxide semiconductor layer 150a, the gate insulating layer 140, and the buffer layer 120, after which a third photosensitive film 70 is formed on the second gate metal layer 120b. Here, the third photosensitive film 70 is formed on a portion of the second gate metal layer 120b that corresponds to the gate insulating layer 140, and on a portion of the second gate metal layer 120b that corresponds to the capacitor insulating layer 141.

Referring to FIG. 11, the first gate metal layer 120a and the second gate metal layer 120b are etched using the third photosensitive film 70 as a mask.

Here, the gate electrode 124 is formed on the gate insulating layer 140, and the capacitor upper electrode 125 and the gate metal pattern 126 are sequentially formed on the capacitor insulating layer 141. The gate electrode 124 includes the first gate electrode 124a on the gate insulating layer 140 and the second gate electrode 124b on the first gate electrode 124a.

Referring to FIG. 12, the third photosensitive film 70 is removed and a fourth photosensitive film 75 is formed on the gate electrode 124, after which the gate metal pattern 126 is etched and removed using the fourth photosensitive film 75 as a mask. Here, during wet etching, the gate metal pattern 126 is removed, but not the capacitor upper electrode 125.

Next, the fourth photosensitive film 75 is removed, and the remaining process steps are the same as those of a manufacturing method of an OLED display according to FIGS. 2 to 9.

A manufacturing method of an OLED display according to another exemplary embodiment of the present disclosure will now be described with reference to FIGS. 13 to 16.

FIGS. 13 to 16 are schematic cross-sectional views of a manufacturing method of an OLED display according to another exemplary embodiment of the present disclosure.

A manufacturing method of an OLED display according to a present exemplary embodiment is substantially the same as a manufacturing method of an OLED display according to FIGS. 2 to 9, except for a process of forming the capacitor upper electrode 125. Accordingly, a duplicate description of the same method will be omitted.

Figure 13:
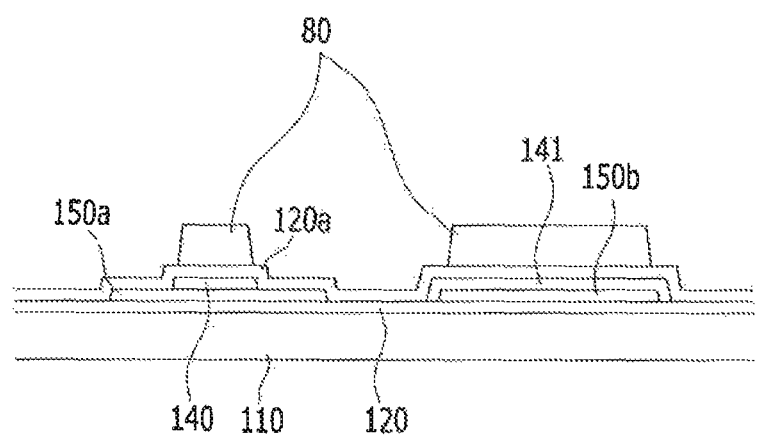
FIGS. 13 to 16 are schematic cross-sectional views of a manufacturing method of an OLED display according to yet another exemplary embodiment of the present disclosure.

Referring to FIG. 13, the buffer layer 120 is formed on the substrate 110, and the first and second spaced apart oxide semiconductor layers 150a and 150b are formed on the buffer layer 120.

Next, the gate insulating layer 140 is formed on the first oxide semiconductor layer 150a, and the capacitor insulating layer 141 is formed on the second oxide semiconductor layer 150b.

Subsequently, the first gate metal layer 120a is formed on the first oxide semiconductor layer 150a, the gate insulating layer 140, the capacitor insulating layer 141, and the buffer layer 120, after which a fifth photosensitive film 80 is formed on the first gate metal layer 120a. Here, the fifth photosensitive film 80 is formed on a portion of the first gate metal layer 120a that corresponds to the gate insulating layer 140 and on a portion of the first gate metal layer 120a that corresponds to the capacitor insulating layer 141.

Figure 14:
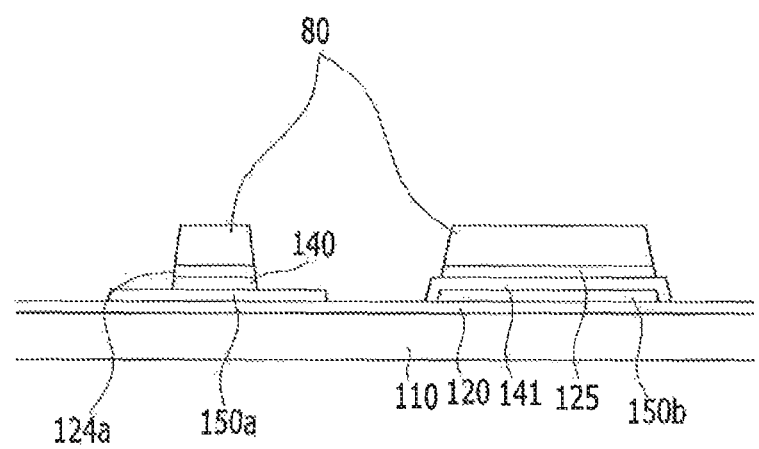

Referring to FIG. 14, the first gate metal layer 120a is etched using the fifth photosensitive film 80 as a mask.

Here, the first gate electrode 124a is formed on the gate insulating layer 140, and the capacitor upper electrode 125 is formed on the capacitor insulating layer 141.

Figure 15:
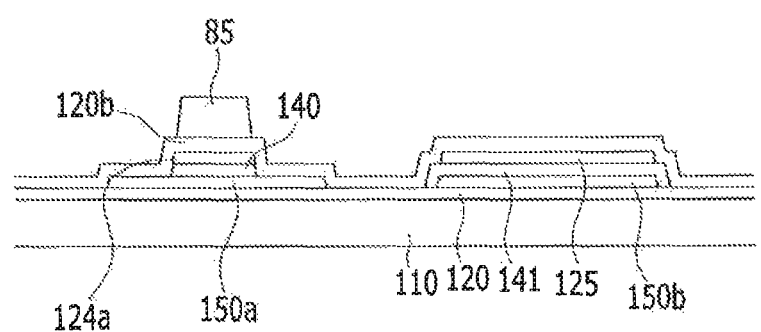

Referring to FIG. 15, the fifth photosensitive film 80 is removed, the second gate metal layer 120b is formed on the first oxide semiconductor layer 150a, the first gate electrode 124a, the capacitor upper electrode 125, and the buffer layer 120, and a sixth photosensitive film 85 is formed on the second gate metal layer 120b. Here, the sixth photosensitive film 85 is formed on a portion of the second gate metal layer 120b that corresponds to the first gate electrode 124a.

Figure 16:
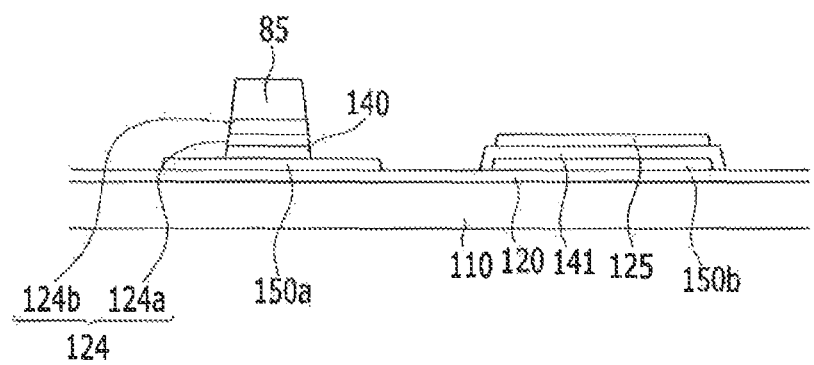

Referring to FIG. 16, the second gate metal layer 120b is etched using the sixth photosensitive film 85 as a mask.

Here, the second gate electrode 124b is formed on the first gate electrode 125a. That is, the gate electrode 124, which includes the first gate electrode 124a and the second gate electrode 124b, is formed.

Next, the sixth photosensitive film 85 is removed, and the remaining processes are the same as those of a manufacturing method of an OLED display according to FIGS. 2 to 9.

While embodiments of this disclosure have been described in connection with what is presently considered to be practical exemplary embodiments, it is to be understood that embodiments of the disclosure are not limited to the disclosed embodiments, but, on the contrary, are intended to cover various modifications and equivalent arrangements included within the spirit and scope of the appended claims.

What is claimed is:

1. An organic light emitting diode display, comprising:
    a substrate;
    a thin film transistor and a storage capacitor that are disposed and spaced apart from each other on the substrate; and
    an organic light emitting diode that is connected to the thin film transistor, wherein
    the thin film transistor includes:
        a semiconductor layer that includes a channel region, a source region, and a drain region;
        a gate insulating layer disposed on the channel region;
        a gate electrode disposed on the gate insulating layer and including a first gate electrode disposed on the gate insulating layer and a second gate electrode disposed on the first gate electrode;
        a source electrode connected to the source region; and
        a drain electrode that is spaced apart from the source electrode and is connected to the drain region,
    the storage capacitor includes
        a capacitor lower electrode,
        a capacitor insulating layer disposed on the capacitor lower electrode, and
        a capacitor upper electrode disposed on the capacitor insulating layer,
    the capacitor lower electrode is a conducting oxide semiconductor into which hydrogen has diffused,
    the capacitor upper electrode is formed of a material that hydrogen can penetrate,
    the first gate electrode and the capacitor upper electrode include at least one of indium tin oxide and indium zinc oxide,
    the semiconductor layer and the capacitor lower electrode are disposed on the same layer, and
    the gate insulating layer and the capacitor insulating layer are spaced apart from each other.

2. The organic light emitting diode display of claim 1, wherein the semiconductor layer includes an oxide semiconductor.

3. The organic light emitting diode display of claim 2, wherein the gate insulating layer and the capacitor insulating layer are made of a same material.

4. The organic light emitting diode display of claim 1, wherein the capacitor insulating layer covers side surfaces of the capacitor lower electrode.

5. The organic light emitting diode display of claim 1, wherein the first gate electrode and the capacitor upper electrode are made of a same material.

6. The organic light emitting diode display of claim 1, wherein the second gate electrode includes at least one of titanium, a titanium-molybdenum alloy, and an aluminum oxide.

7. The organic light emitting diode display of claim 2, further comprising
    an interlayer insulating layer disposed on the gate electrode and the capacitor upper electrode and that includes at least one of a silicon nitride and a silicon oxide,
    wherein the source electrode and the drain electrode are disposed in the interlayer insulating layer.

8. The organic light emitting diode display of claim 7, wherein the interlayer insulating layer includes a source exposure hole that exposes the source region and a drain exposure hole that exposes the drain electrode,
    the source electrode is connected to the source region through the source exposure hole, and the drain electrode is connected to the drain region through the drain exposure hole.

* * * * *